United States Patent [19]

Hammar

[11] Patent Number: 5,099,499
[45] Date of Patent: Mar. 24, 1992

[54] METHOD OF GENERATING QUALITY FACTORS FOR BINARY DIGITS OBTAINED IN THE VITERBI-ANALYSIS OF A SIGNAL

[75] Inventor: Claes L. Hammar, Täby, Sweden

[73] Assignee: Telefonaktiebolaget L M Ericsson, Stockholm, Sweden

[21] Appl. No.: 583,309

[22] Filed: Sep. 17, 1990

[30] Foreign Application Priority Data

Sep. 19, 1989 [SE] Sweden .................... 8903079

[51] Int. Cl.⁵ .................... H04L 1/00; G06F 11/00
[52] U.S. Cl. .................... 375/94; 371/43
[58] Field of Search ............ 375/17, 27, 37, 39, 375/57, 75, 94; 371/43, 44, 45

[56] References Cited

U.S. PATENT DOCUMENTS

| | | | |
|---|---|---|---|
| 4,038,636 | 7/1977 | Doland | 371/43 |
| 4,240,156 | 12/1980 | Dolan | 371/43 |
| 4,748,626 | 5/1988 | Wong | 371/43 |
| 4,756,007 | 7/1988 | Qureshi et al. | 375/8 |
| 4,777,636 | 10/1988 | Yamashita et al. | 371/43 |
| 4,847,871 | 7/1989 | Matsushita et al. | 375/94 |
| 4,888,779 | 12/1989 | Karabed et al. | 371/43 |
| 4,905,317 | 2/1990 | Suzuki et al. | 371/43 |

FOREIGN PATENT DOCUMENTS 0052463  5/1982  European Pat. Off.

OTHER PUBLICATIONS

The Viterbi Algorithm, by G. David Forney, Jr., Proceedings of the IEEE, vol. 61, No. 3, Mar. 1973.
Convolutional Codes and Their Performance in Communication Systems, by Andrew J. Viterbi, IEEE Transactions on Communications Technology, vol. COM-10, No. 5, Oct. 1971.
Maximum Likelihood Sequence Estimation (The Viterbi Algorithm) Applied to Data Transmission Systems with Intersymbol Interference, by David Falconer, Department of Electrical Engineering, Linkoping University, Linkoping, Sweden.
Performance Improvement of Viterbi Decoding for FM Recording Code, by H. Osawa, S. Yamashita and S. Tazaki, Electronics & Communication Engineering Journal, Jul./Aug. 1989.
Basics of Communication and Coding, pp. 128-133, by William G. Chambers Clarendon Press, Oxford 1985.

*Primary Examiner*—Benedict V. Safourek
*Assistant Examiner*—Young Tse
*Attorney, Agent, or Firm*—Burns, Doane, Swecker & Mathis

[57] ABSTRACT

A signal is transmitted to a receiver and is digitalized in signal points (S1). These points are viterbi analyzed in an analyzer with a path memory (PM) having a desired number of states (00, 01, 10, 11) with memory cells (MC). Bit sequences, corresponding to the signal points (S1), are generated and final metric values (m0, m1+g1, m1, m3) for the bit sequences are calculated. In an indicated bit position the best bit sequence, with the smallest final metric value (m2), has a "1", which is the decided bit value. An alternative bit sequence is generated, which is the best bit sequence with the smallest final metric value (m0+g0) under the condition that in the indicated bit position there is bit with the opposite bit value, a "0". The difference between both the final metric values (m0+m0−m2) is a quality factor for the decided bit value "1". The calculation is made in three steps. At a time point metric values (m0, m1, m2, m3) have been calculated for the different states (00, 01, 10, 11). For a signal point in the indicated bit position, additive metric values ($\Delta(0\rightarrow 0)$, $\Delta(1\rightarrow 0)$) are calculated in the first step. From the additive metric values are calculated new metric values and part values of the quality factor. In the second step the part values are modified for the calculation steps through the path memory (PM), so that final part values (g0, g1, g2, g3) of the quality factor are obtained. In the third step bit sequences are selected as above and the quality factor (m0+g0−m2) is calculated.

7 Claims, 3 Drawing Sheets

METHOD OF GENERATING QUALITY FACTORS FOR BINARY DIGITS OBTAINED IN THE VITERBI-ANALYSIS OF A SIGNAL

TECHNICAL FIELD

The present invention relates to a method in a digital radio transmission system for transmitting signals between a transmitting and a receiving radio station, a method of generating quality factors for binary digits obtained in the receiving radio station, said receiving radio station comprising a signal receiver for receiving the transmitted signal, a sampling unit connected to the signal receiver, and a viterbi-analyzer connected to the sampling unit, wherein the binary digits are obtained subsequent to viterbi-analysis in the viterbi-analyzer and the method of generating said quality factors comprises the following method steps:

registering signal points of said transmitted signal in the sampling unit;

analyzing the signal points in accordance with a viterbi-algorithm having a desired number of states, therewith to generate sequences of binary digits, bit sequences;

producing a measurement of the extent to which the bit sequences deviate from the signal points, the metric of the bit sequences;

registering final values of the metric belonging to an indicated position in the bit sequence;

selecting one of the bit sequences belonging to one state of the algorithm, which sequence for the indicated position having the smallest final metric value, and registering the value of the binary end digit in the indicated position belonging to the selected bit sequence.

BACKGROUND OF THE INVENTION

When transmitting information in the form of binary digits or bits, the transmitted bit stream is normally coded before transmission. The received signal is decoded at the receiver, for instance in a viterbi-analyzer and in a manner known per se. The channel over which the information is transmitted is often subjected to interference and the transmission function of the channel is therefore evaluated and estimated in an equalizer. The received signal is processed in the equalizer, which may be a viterbi-analyzer that has been adapted to the channel concerned. The viterbi-analyzer processes the received signal statistically, so that the signal delivered by the analyzer will coincide, as far as possible, with the received signal, in accordance with the maximum likelihood criterion. The bits delivered by the viterbi-analyzer are therefore correct only to a certain degree of probability. A measurement of this probability, a quality factor or so-called soft information, can be calculated and utilized for continued signal processing, thereby enabling signal processing to be improved.

Described in, for instance, U.S. Pat. No. 4,240,156 is a method of calculating such a probability value for each decoded bit. Although signal processing is improved, it is mentioned in the Patent that difficulties are encountered in carrying out the method, difficulties which in part are of a purely mathematical nature. Simplified methods of calculating probability values or factors are also known in which, for instance, a whole sequence of bits is allotted the same quality factor. The signal processing improvements achieved with the simplified methods are less significant than the improvements achieved with those methods in which each bit is allotted a quality factor.

SUMMARY OF THE INVENTION

The aforesaid problems experienced in generating quality factors for binary digits that have been obtained by a viterbi-analysis are solved in the following manner. The viterbi-analyzer demodulates a received signal, by estimating, in a known manner, a bit sequence which differs from the received signal as little as possible, in the meaning of the maximum likelihood method. When demodulating, the viterbi-analyzer generates a final metric which is a measurement of the extent to which the estimated bit sequence deviates from the received signal. According to the invention, there is calculated in the viterbi-analyzer an alternative bit sequence which in an observed bit position has a logic zero when the aforesaid best bit sequence has a logic one and which in said observed position has a logic one when the best bit sequence has a logic zero. The alternative bit sequence is the best sequence, or at least a good estimate of the best sequence that can be obtained, with the restriction that a logic one shall be exchanged for a logic zero and vice versa in the observed bit position. A final metric is also calculated for the alternative bit sequence. The difference between the final metrics for the best and the alternative sequence constitutes a quality factor for the observed bit. A corresponding calculation is made for all received signal points, so that each bit obtains its respective quality factor. The quality factors for the bits in a limited bit sequence can be normalized, by dividing the calculated quality factors by the total final metric of the limited bit sequence.

BRIEF DESCRIPTION OF THE DRAWINGS

An exemplifying embodiment of the invention will now be described with reference to the accompanying drawings, in which.

DETAILED DESCRIPTION OF THE PREFERRED EMBODIMENT

Figure 1:
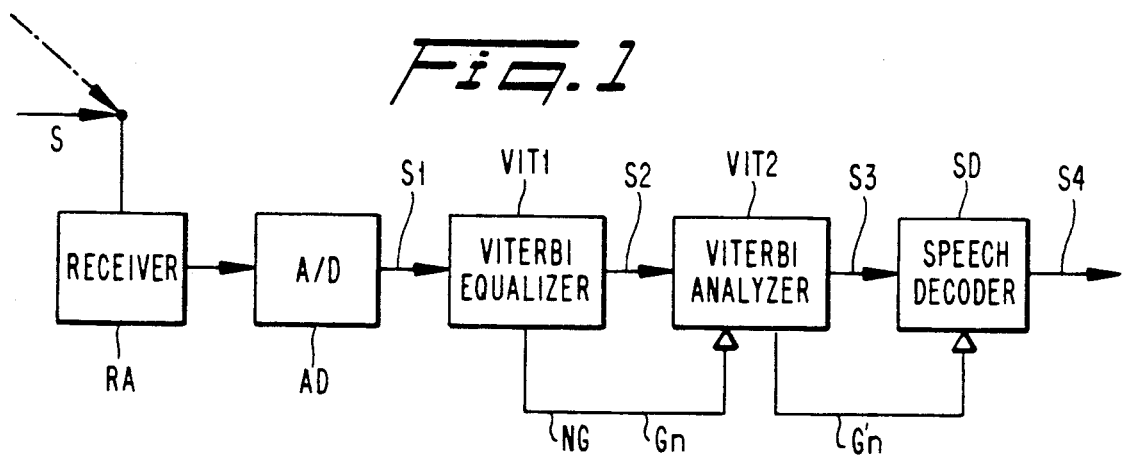
FIG. 1 illustrates schematically a signal receiver fitted with a viterbi-analyzer.
Figure 2:
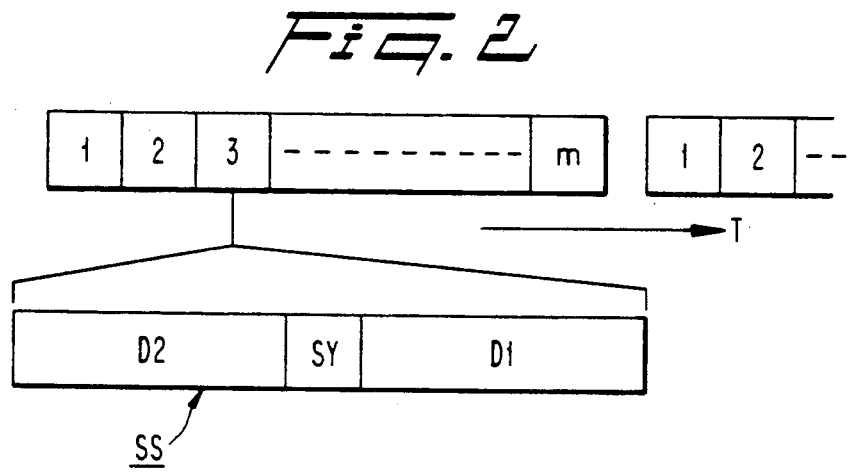
FIG. 2 illustrates time slots with signal sequences in a time-shared transmission system.
Figure 3:
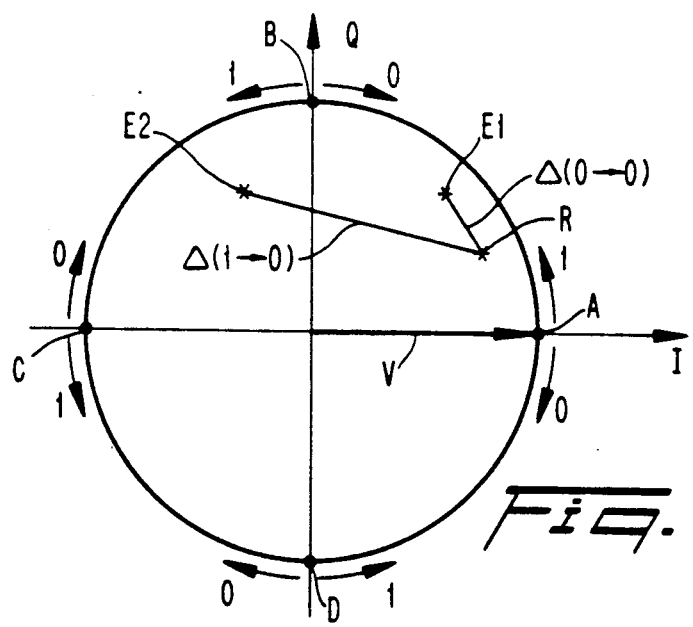
FIG. 3 is a diagramme showing signal pints of a phase-modulated signal.

FIG. 1 illustrates a receiver for radio signal S. The receiver comprises a signal receiver RA, an analog-digital converter AD, a viterbi-equalizer VIT1, a channel decoder in the form of a viterbi-analyzer VIT2, and a speech decoder SD. The receiver may be incorporated in a time-shared radio transmission system intended, for instance, for mobile telephones having channels 1-m for individual subscribers, as illustrated in FIG. 2, in which T indicates time. Each channel has a respective time slot during which a signal sequence SS is transmitted. The signal sequence includes a synchronizing sequence SY in the centre of the time slot, and two data sequences D1 and D2. The transmitted signal sequence carries information in the form of phase-modulated binary digits, as illustrated in FIG. 3. A vector V in an I-Q plane is characterized by its amplitude and its phase. The vector is rotated between the points A, B, C, D, wherein clockwise rotation is designated "0" and rotation in the counter-clockwise direction is designated "1". Prior to transmitting the information from a transmitter (not shown), channel coding is carried out in a known manner, for instance with the aid of a convolutional code and digital-analog conversion of the signal. The transmitted signal will be subjected to interference during its transmission to the receiver in FIG. 1, such that the received analog signal S will, for instance, contain noise or will have been subjected to multipath propagation. The signal S is digitalized in the analog-digital converter AD to form a digital signal S1 which is delivered to the equalizer VIT1, which is adapted to prevailing channel conditions by the synchronizing sequence SY, in a known manner. The equalizer VIT1 produces a signal S2, a sequence of binary digits, which is an estimation of the channel-coded signal of the transmitted prior to said digital-analog conversion, and S2 is decoded in the decoder VIT2. This decoder, in turn, sends a digital signal S3 to the speech decoder SD, which converts the signal S3 to a speech signal S4.

The signal S2 comprises a sequence of zeroes and ones which are calculated in the viterbi-equalizer VIT1, in a known manner. A received signal point of the signal S1 may, for instance, lie on a point R in FIG. 3. During the analysis in VIT1, there are obtained signal points E1 and E2 which are distanced from R. These distances correspond to a measurement, the metric, of the extent to which the calculated signal points deviate from the received signal points. VIT1 endeavours, in a known manner, to hold the subsequently summated metric as small as possible. In this way, there is obtained an estimation according to the maximum likelihood criterion, such that the extent to which the signal sequence estimated in VIT1 from the signal S1 will be as small as possible. The value of the bits in the signal are estimated with individual probabilities and channel decoding can be improved by calculating and transmitting a corresponding quality factor Gn together with its bit to the decoder VIT2, in accordance with FIG. 1. The manner in which this quality factor is calculated in accordance with the present invention will be described hereinafter.

Figure 4:
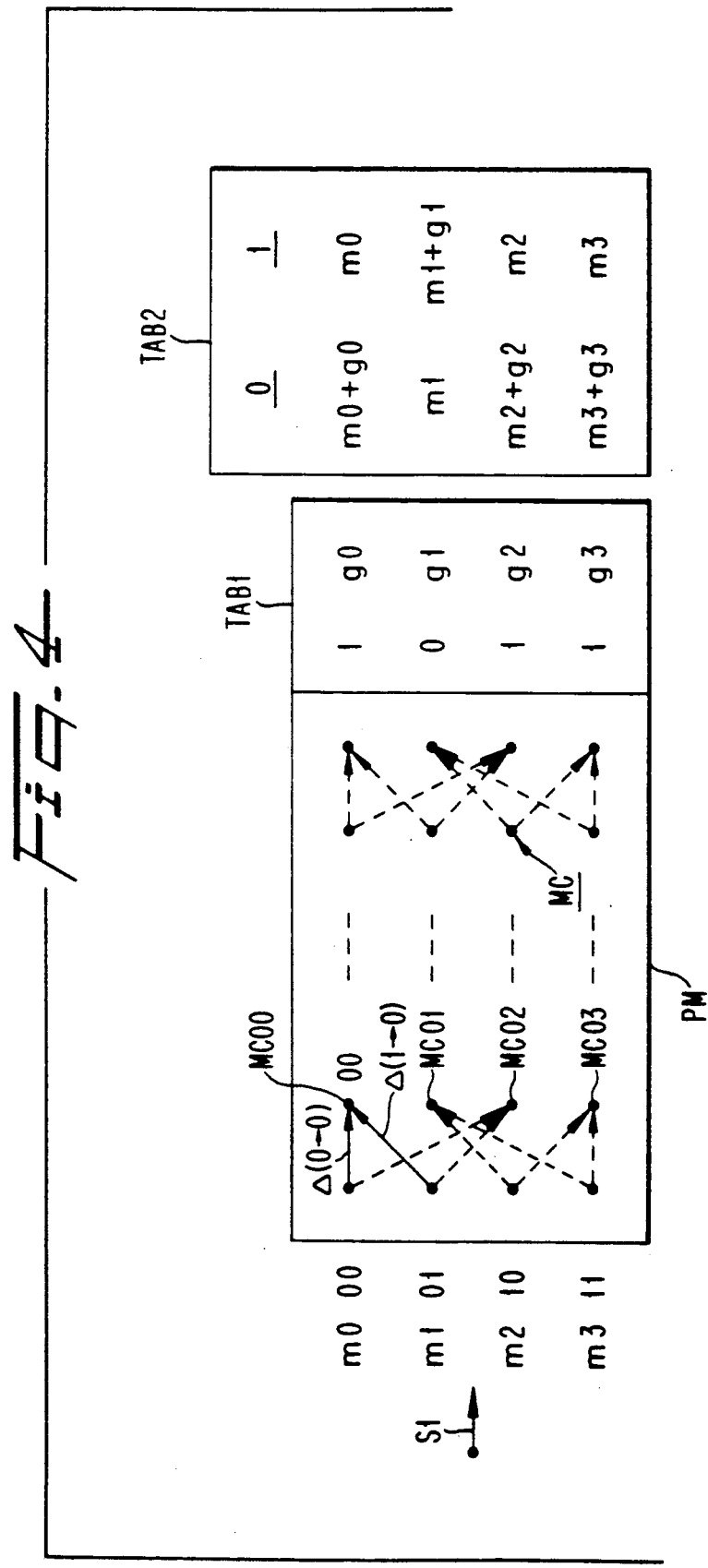
FIG. 4 illustrates schematically the path memory of the viterbi-analyzer and quality-factor calculation tables.
Figure 5:
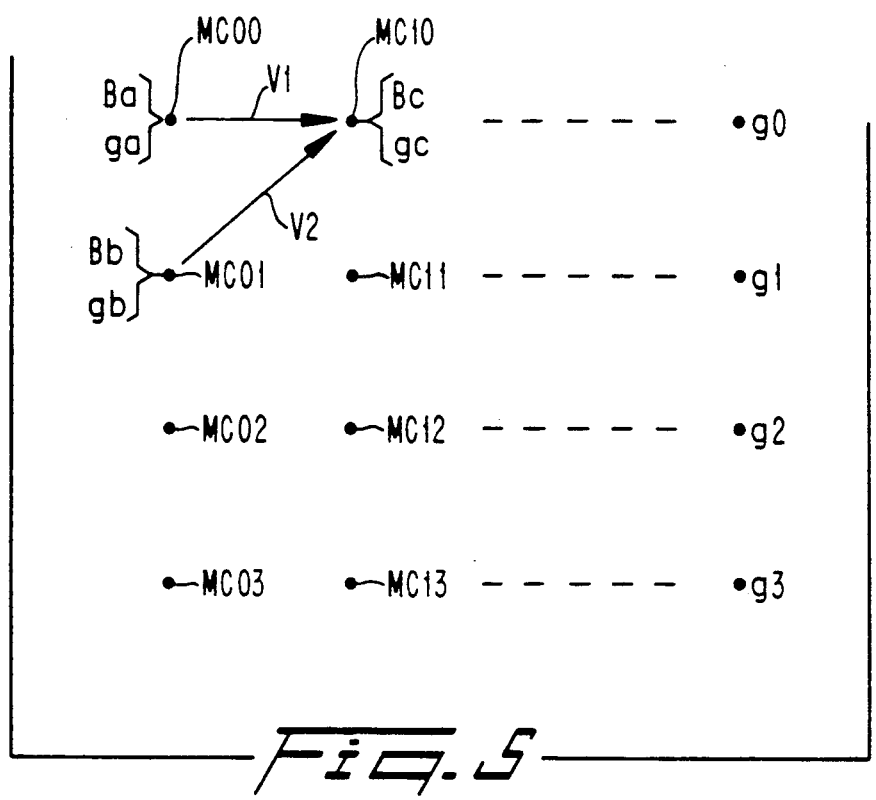
FIG. 5 illustrates part of the memory cells of the path memory with stored information.

The viterbi-equalizer VIT 1 in FIG. 1 has, in a known manner, a path memory PM which has four states 00, 01, 10 and 11, as illustrated in FIG. 4. The path memory has memory cells, generally referenced MC. The invention method of calculating quality factors can be divided into three stages. The first stage comprises the manner of incorporating a new signal point in the calculation and in the path memory PM. In the traditional viterbi-analysis of the received signal points, the summated metric value m0 in the first state of a signal sequence whose two last bits are 00 is obtained prior to a given time point Tn. Corresponding calculations are carried out for the remaining states, with the summated metric values m1, m2 and m3 respectively. The signal points analyzed prior to the time point Tn are stored in a metric memory, not shown. At the time point Tn, a new signal point in the signal S1 enters the path memory PM, for instance the signal point R shown in FIG. 3. Two transitions in the path memory with addition metrics $\Delta(0\rightarrow 0)$ and $\Delta(1\rightarrow 0)$ respectively lead to the memory cell MC00. The two transitions correspond to the estimated signal points E1 and E2. The signal sequence which corresponds to the transition V1 has a new metric value $m(0\rightarrow 0) = m0 + \Delta(0\rightarrow 0)$ and the signal sequence which corresponds to the transition V2 has a new metric value $m(1\rightarrow 0) = m1 + \Delta(1\rightarrow 0)$. A bit decision is made and either a one or a zero is stored in the memory cell MC00, in accordance with the viterbi algorithm. Metric values corresponding to the best path in the path memory are stored in the metric memory. According to the invention, a metric value is also calculated for the best path in the path memory, provided that the opposite bit decision is made. A part value $$ga = /\ m(0\rightarrow 0) - m(1\rightarrow 0)\ /$$

of the ultimate quality factors is calculated, the resultant sum being the difference between the two new metric values. The part-value ga is also stored in the memory cell MC00, as illustrated in FIG. 5. Correspondingly, part-values of the quality factor for the remaining states are calculated and stored in the memory cells MC01, MC02 and MC03, the part-value gb, for instance, is stored in the memory MC01.

The second stage in accordance with the inventive method comprises modifying the aforesaid part-values as calculations are made through the path memory PM. A part of the path memory PM is shown in FIG. 5. As mentioned in the aforegoing, the memory cell MC00 has stored therein either a one or a zero, and also the part-value ga of the quality factor. Correspondingly, a binary digit and the part-value gb are stored in the memory cell MC01. The summated metric values $m(0\rightarrow 0)$ and $m(1\rightarrow 0)$ respectively are stored in said metric memory. The calculated binary digits are referenced Ba and Bb in FIG. 5. The binary digit to be calculated according to the viterbi-algorithm in the memory cell MC10 has been referenced Bc and the new part-value of the quality factor has been referenced gc. The value of the binary digit Bc is determined, in a known manner, in accordance with the viterbi-algorithm, depending on which path in the path memory PM has the least metric. According to the invention, the new part-value gc of the quality factor is calculated from ga, gb, $m(0\rightarrow 0)$ and $m(1\rightarrow 0)$, wherein two cases can occur. In the first case, the assumption that Ba = Bb applies. Assume in the present example that Ba = 0 and that thus Bb = 1 and that the transition 0—0, referenced V1, has the smallest metric. There is then obtained, in a known manner, Bc = 0 and the metric value $m(0\rightarrow 0)$. According to the invention, the metric for the best path in the path memory PM is calculated, provided that the opposite bit decision is made, i.e. that Bc = 1. This enables selection of the path V1 with the metric $m(0\rightarrow 0) + ga$ or the path V2 with the metric $m(1\rightarrow 0)$. In the first instance, the new part-value of the quality factor will be the smallest of $$gc = m(0\rightarrow 0) + ga - m(0\rightarrow 0) = ga$$

or $$gc = m(1\rightarrow 0) + gb - m(0\rightarrow 0).$$

In the second case, the assumption that Ba = Bb will apply. In this way, the new part-value is obtained in a manner corresponding to the above as the smallest of $$gc = m(0\rightarrow 0) + ga - m(0\rightarrow 0) = ga$$

or $$gc = m(1 \rightarrow 0) + gb - m(0 \rightarrow 0).$$

The new part-value gc is stored in the memory cell MC10 together with the decided bit Bc. In a manner corresponding to that described above, a new part-value of the quality factor is calculated for all of said states and stored in the memory cells MC11, MC12 and MC13. The calculation continues in this way, stepwise through the path memory PM with traditional viterbi-calculation of bits and, according to the invention, with calculations of the part-values of the ultimate quality factor.

The third stage comprises a final calculation of the quality factor Gn for the subsequently calculated binary digits. The part-values of the quality factor for the signal point R received at the time-point Tn, according to FIG. 3, have been calculated up to the end of the part memory PM, in the aforedescribed manner. The final part-values G0, G1, G2 and G3 for the respective states 00, 01, 10 and 11 have been obtained in this way. These final part-values are shown in FIG. 4 in a table TAB1 at the end of the path memory PM. Also shown are the binary digits obtained traditionally, these digits in the illustrated example being assumed to be 1, 0, 1 and 1 for respective states. The viterbi-analyzer VIT1 with its path memory PM can, according to the viterbi-algorithm, decide to deliver a "0" or "1" and the new metric values for "0" and "1" respectively are given in two columns in a table TAB2. Assume, according to the example, that the smallest of all the metric values in TAB2 is m2. VIT1 will then deliver as the latest digit a "1", since m2 stands in the column for a "1". For the purpose of obtaining the aforesaid quality factor Gn, a search is made for the smallest of the digits in the opposite column, according to the illustrated example the column under "0". Assume that the smallest number in this column is m0+g0. The quality factor for the decided "1" is calculated according to Gn=m0+g0−m2, which is transmitted to VIT2 with the decided binary digit "1", according to FIG. 1.

Relatively complicated calculations are made in the aforedescribed method, and a simplified calculation of the quality factor Gn can be made in the following manner. The calculation of the quality factor has been described in three stages, in the second of which the part-value gc was calculated. According to the example, the transition V1 in FIG. 5 was chosen for the bit values. This method can be simplified by allowing the part-values of the quality factor Gn to be transferred in the same manner as the bit values. Thus, in accordance with the example, gc=ga will be independent of the binary values of Ba and Bb. Simulations have shown that the errors occurring in the quality factor will be relatively small. A further simplification can be made during the third stage when calculating the quality factor Gn. There is selected from the table TAB2 that part-value of the quality factor which applies to the same state as the binary digit chosen in accordance with the viterbi-algorithm. According to the above example, it was assumed that the smallest metric value was m2, which as a final selection of digits gave "1". The part-value g2 stands in the opposite column and, according to the simplified method, becomes the quality factor Gn.

When transmitting the signal S of FIG. 1, the channel conditions and noise conditions can change radically from the one signal sequence SS to the other. Examples of such changes include fading, which introduces a time dependency in the statistical distribution of the noise. Under these conditions, the quality of the quality factor Gn can be improved by normalization. This normalization is effected by dividing the quality factor by the summated metric obtained during a limited time interval and with respect to the number of bits, e.g. during the time of the data sequence D1. Assume that the final metric for the data sequence D1 is M. According to the above example, the bit decoded at the time point Tn had the quality factor Gn=m0+g0−m2 and the normalized quality factor becomes $$NG = \frac{m0 + g0 - m2}{M}$$

The aforedescribed method is not connected with a viterbi-equalizer, but can be applied in any viterbi-analyzer whatsoever. For instance, the method can be applied with the channel decoder VIT2, so as to enable a quality factor Gn to be transmitted parallel with the channel-decoded bits in the signal S3. The speech decoder SD utilizes the quality factor Gn to create an improved speech signal S4 from the bits in the signal S3. The transmitted signal may be modulated in a different way than by the phase modulation illustrated in FIG. 3, and the signal sequence SS may be have the data sequences D1 and D2 and the synchronizing sequence SY in a format which differs from the format illustrated in FIG. 2.

Figure 6:
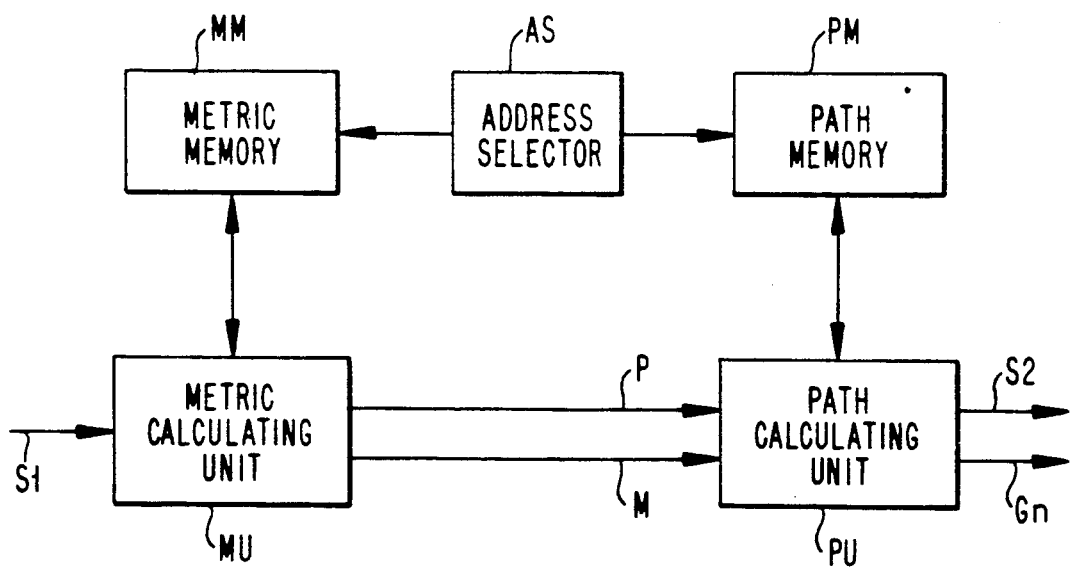
FIG. 6 is a block schematic of the viterbi analyzer.

In the foregoing, the inventive method of producing a quality factor has been described with reference to the viterbi-analyzer VIT1, and FIG. 6 illustrates a block schematic of this analyzer. The Figure illustrates the path memory PM and the metric memory, reference MM, these memories being connected to a control unit, an address selector AS. The metric memory MM is connected to a metric calculating unit MU in which renewed metric values are calculated and a path selection made. Correspondingly, the path memory PM is connected to a path calculating unit PU, in which calculations are made for shifting the path in the path memory PM for each new bit received. The bit decisions and calculations of the quality factors Gn and NG are also carried out in PU. The metric calculating unit MU is connected to the analog-digital converter AD and receives the signal S1 therefrom. The path calculating unit PU has inputs connected with the metric calculating unit MU and outputs which are connected to the viterbi-analyzer VIT2, which is not shown in FIG. 6.

The metric values in the above example, for instance the metric values m0, m1, m2 and m3, are stored in the metric memory MM. The metric calculating unit MU receives signal points in the signal S1, for instance the signal point R in FIG. 3. The unit MU calculates the new metric values, for instance m (0→0) and m (1→0) and selects the path which has the smallest metric and sends the new metric values to the metric memory MM.

The path calculating unit PU receives from the metric calculating unit MU the metric values m (0→0) and m (1→0), a signal M, and also through a signal P information concerning the path selected. The path calculating unit PU shifts the path in the path memory PM for each new bit, and calculates the binary digits Ba, Bb and Bc. The part-values of the quality factor ga, gb and gc are also calculated in the path calculating unit PU. The calculated binary digits and the part-values are stored in the path memory PM, as described above. The address selector AS steps forward, pairwise, a metric value in the metric value MM and the corresponding path in the path memory PM. The final bit decision "0" or "1", according to the above, is made in the path calculating unit and the quality factor Gn is calculated. The signal S2 constitutes the subsequently decided bits which are delivered together with their respective quality factors.

I claim:

1. In a digital radio transmission system for transmitting signals between a transmitting radio station and a receiving radio station, a method of generating quality factors for binary digits obtained from signals received in said receiving radio station, said method comprising:
   sampling said received signal;
   analyzing said signal samples in accordance with a viterbi-algorithm having a desired number of states to generate binary bit sequences;
   measuring a deviation of said bit sequences from said signal samples to define a metric associated with each of said bit sequences;
   calculating final values of said metric associated with each bit sequence;
   selecting one of said bit sequences associated with one state of said viterbi-algorithm having the smallest final metric value,
   registering a value of a last binary digit of said selected bit sequence;
   generating alternative bit sequences for each state using said viterbi-algorithm, said alternative bit sequences having a last binary digit value opposite from that of said last binary digit in said selected bit sequence;
   generating final values of metrices of said alternative bit sequences; and
   calculating a difference between said final metric value of one of said alternative bit sequences and said final metric value of said selected bit sequence.

2. A method according to claim 1, wherein said final value generating step further comprises:
   calculating metric values in a first calculating stage of said viterbi-algorithm for all states of said viterbi-algorithm;
   making a first bit decision for each state;
   calculating metric values in remaining calculating stages of said viterbi-algorithm for each state;
   making a second bit decision for each state;
   calculating an alternative metric value for each state;
   making a second bit decision opposite to said selected bit sequence for each state;
   calculating part values of said quality factor for each state as a difference between said alternative metric value and said metric value for said selected bit sequence for each state;
   calculating alternative metric values in remaining calculating stages of said algorithm for each of said states based on separate transitions between said states;
   making a bit decision opposite to said selected bit sequence for each state; and
   calculating modified part-values of said quality factor for each state in said remaining calculating stages as a difference between one of said alternative metric values and a corresponding metric value of said selected bit sequence.

3. A method according to claim 2, further comprising:
   calculating said modified part-values of said quality factor as a difference between the smallest of said alternative metric values and a corresponding metric value for said selected bit sequence.

4. A method according to claim 2, wherein said step of calculating said modified part-values of said quality factor further comprises:
   selecting those modified part-values that have the same sequence of bits as the sequence of bits in the selected bit sequence.

5. A method according to claim 1, further comprising:
   calculating said quality factor as the smallest difference between said final metric for one of said alternative bit sequences and said final metric for said selected bit sequence.

6. A method according to claim 1, wherein two final metric values belong to the same state of said viterbi-algorithm.

7. A method according to claim 1, wherein a sequence of said signal samples is delimited, further comprising:
   calculating a normalized quality factor as a quotient between said quality factor and a final value of said metric obtained for said delimited sequence of signal samples.

* * * * *